United States Patent
Veilleux, Jr.

(10) Patent No.: US 8,424,285 B2
(45) Date of Patent: Apr. 23, 2013

(54) COOLING SYSTEM FOR ELECTRONIC DEVICE IN A GAS TURBINE ENGINE SYSTEM

(75) Inventor: Leo J. Veilleux, Jr., Wethersfield, CT (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 936 days.

(21) Appl. No.: 12/533,216

(22) Filed: Jul. 31, 2009

(65) Prior Publication Data
US 2011/0023447 A1    Feb. 3, 2011

(51) Int. Cl.
*F02C 7/12* (2006.01)
(52) U.S. Cl.
USPC .............................. 60/39.83; 60/730
(58) Field of Classification Search .............. 60/39.83, 60/266, 267, 730, 734; 244/118.5
See application file for complete search history.

(56) References Cited

U.S. PATENT DOCUMENTS

| | | | |
|---|---|---|---|
| 3,623,546 A | 11/1971 | Banthin et al. | |
| 3,733,816 A * | 5/1973 | Nash et al. | 60/39.281 |
| 4,273,304 A * | 6/1981 | Frosch et al. | 244/117 A |
| 4,608,819 A | 9/1986 | Colman et al. | |
| 4,773,212 A * | 9/1988 | Griffin et al. | 60/772 |
| 4,776,536 A * | 10/1988 | Hudson et al. | 244/135 R |
| 5,105,875 A * | 4/1992 | McArthur | 165/41 |
| 5,226,471 A * | 7/1993 | Stefani | 165/200 |
| 6,182,435 B1 | 2/2001 | Niggemann et al. | |
| 6,415,595 B1 * | 7/2002 | Wilmot et al. | 60/785 |
| 6,434,473 B1 | 8/2002 | Hattori | |
| 6,948,331 B1 * | 9/2005 | Ho | 62/401 |
| 8,042,343 B2 * | 10/2011 | Jarlestal | 62/7 |
| 8,205,427 B2 * | 6/2012 | Schwarz et al. | 60/39.08 |
| 8,307,662 B2 * | 11/2012 | Turco | 60/782 |
| 2005/0016176 A1 | 1/2005 | Griffiths et al. | |
| 2010/0107593 A1 * | 5/2010 | Wang | 60/39.83 |
| 2010/0242492 A1 | 9/2010 | Sloat et al. | |

FOREIGN PATENT DOCUMENTS

| | | |
|---|---|---|
| EP | 1878878 A2 | 1/2008 |
| GB | 2095757 A | 10/1982 |

OTHER PUBLICATIONS

Combined Search and Examination Report Under Sections 17 and 18(3) for European Patent Application GB1012928.6.

* cited by examiner

*Primary Examiner* — Phutthiwat Wongwian
(74) *Attorney, Agent, or Firm* — Kinney & Lange, P.A.

(57) ABSTRACT

A cooling system for electronics in a gas turbine engine system comprises an electronic device cooled by a fluid recirculation loop. The fluid recirculation loop comprises a fluid line to carry coolant fluid, a heat pump on the fluid line for removing heat from the coolant fluid, and a fluid pump on the fluid line to circulate the coolant fluid through the loop. The electronic device is in thermal communication with the fluid circulation loop.

20 Claims, 5 Drawing Sheets

COOLING SYSTEM FOR ELECTRONIC DEVICE IN A GAS TURBINE ENGINE SYSTEM

BACKGROUND

The present invention is related to gas turbine engines, and more particularly to the cooling of electronics in the environment of gas turbine engines.

Gas turbine engines operate by combusting fuel in compressed air to create heated gases with increased pressure and density. The heated gases are ultimately forced through an exhaust nozzle, which is used to step up the velocity of the exiting gases and in turn produce thrust for driving an aircraft. In modern aircraft, the rate at which fuel is supplied to the engine is typically controlled electronically via an Electronic Engine Control (EEC) device. EECs with autonomous control over engine fuel regulation, and no capacity for pilot override, are commonly called Full Authority Digital Engine Control (FADEC) units. An EEC (or FADEC) receives input of multiple variables, including engine pressure and temperature, throttle state, and fuel pressure, and must therefore be connected to the engine and fuel systems. The engine environment, however, can reach extreme temperatures during operation. High temperatures diminish the lifetime of the electronics of the EEC, and in extreme temperatures the EEC may cease to function altogether.

Military and commercial aircraft typically utilize different methods for keeping the EEC cool. In military aircraft, the EEC is frequently mounted on the engine duct, a hot location, and cooled with relatively cool fuel. This fuel either runs directly through the EEC, or through a cooling plate adjacent to the EEC. In commercial engines, by contrast, the EEC is usually mounted on the fan case on the front of the engine housing, a cooler area away from the heat of the engine, so that the EEC does not require fluid cooling.

There are distinct disadvantages to both existing methods for keeping the EEC cool. The distance of the EEC from the engine in a commercial system necessitates a long, heavy harness for wiring and support, to connect the EEC to the engine and fuel system. If cooling were not an issue, the EEC could be placed close to the engine to minimize complexity and reduce weight by as much as 45 kg (~100 lbs) or more.

Typical configurations in military aircraft already place the EEC close to the engine, but existing cooling methods are no longer adequate to reliably keep the EEC cool. Engines and fuel have become hotter as engine loads have increased over the last 20 years, shortening EEC lifetimes and making EEC temperature a limiting factor in aircraft operations.

SUMMARY

The present invention is directed towards a cooling system for electronics in a gas turbine engine system. The cooling system includes an electronic device cooled by a fluid recirculation loop. The fluid recirculation loop comprises a fluid line to carry coolant fluid, a heat pump on the fluid line for removing heat from the coolant fluid, and a fluid pump on the fluid line to circulate the coolant fluid through the loop. The electronic device is in thermal communication with the fluid circulation loop.

DETAILED DESCRIPTION

Figure 1:
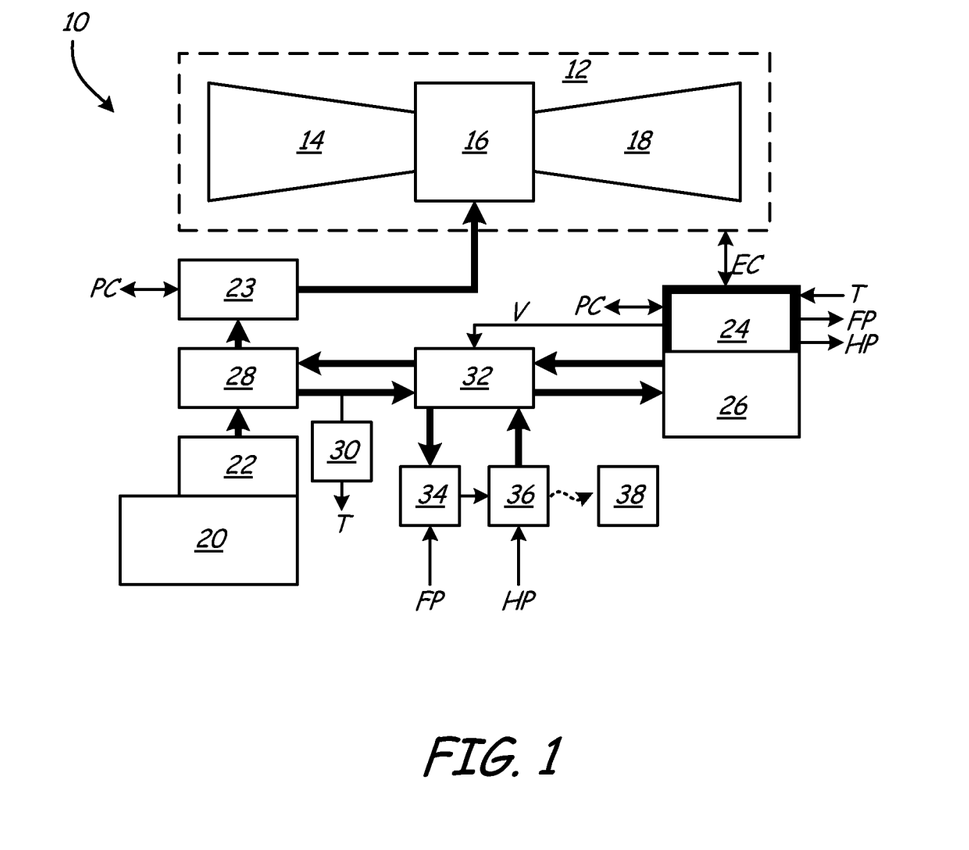
FIG. 1 is a simplified schematic view of a gas turbine engine system, showing a gas turbine engine, a fuel system, and an electronic control device connected to a cooling system.

FIG. 1 is a simplified schematic view of gas turbine engine system 10 with a cooling system for an electronic control device. Gas turbine engine system 10 is comprised of gas turbine engine 12 (having compressor 14, combustor 16, and turbine 18), fuel tank 20, fuel pump 22, metering pump 23, electronic control device 24, heat exchanger 26, fuel line splitter 28, temperature sensor 30, valve 32, fluid pump 34, heat pump 36, and heat sink 38.

In gas turbine engine 12, compressor 14 takes in external gas, compresses it, and forces it into combustor 16. Combustor 16 mixes compressed gas from compressor 14 with fuel pumped from fuel tank 20 by fuel pump 22 and regulated by metering pump 23, and ignites this mixture, causing it to expand into turbine 18. Turbine 18 extracts energy from the expanding mixture of gas and fuel, which powers the compressor and other subsidiary systems. Heated gas which has traversed turbine 18 is expelled as exhaust.

The rate at which metering pump 23 pumps fuel to combustor 16 is governed by electronic control device 24. Electronic control device 24 regulates fuel flow and other engine parameters according to a large number of variables, including engine temperature and pressure, air density, fuel flow, throttle position, and other factors. To monitor these variables, electronic control device 24 is in electronic communication with sensors in the fuel system of gas turbine engine system 10 via pump control signals PC, and with sensors in gas turbine engine 12 via engine control signals EC, forming a feedback loop. Electronic control device 24 determines what engine parameter adjustments are needed and signals gas turbine engine 12 and metering pump 23 via signals PC and EC, respectively. Electronic control device 24 then receives updated input from sensors in gas turbine engine 12 and fuel pump 23 as these systems make adjustments, and the cycle repeats.

Temperatures near gas turbine engine 12 can exceed the effective operating temperature of electronic control device 24. To enable electronic control device 24 to function at elevated temperatures, it is insulated from its environment with insulation 40, and cooled by heat exchanger 26, which draws relatively cool fuel as coolant, diverted by splitter 28 from a fuel line carrying fuel from fuel pump 22 towards combustor 16. Although an imperfect coolant, fuel is used because it is already present in gas turbine engine system 10, and immediately available in the area of electronic control device 24 (as discussed below in other embodiments, different types of coolant fluid can be used instead). The temperature of fuel coming from splitter 28 is measured by temperature sensor 30, and relayed to electronic control device 24.

Heat exchanger 26 is connected to splitter 28 via valve 32, which has two distinct states: an external cooling state in which relatively cool fuel from splitter 28 flows into and out of heat exchanger 26 to cool electronic control device 24, and an isolation state in which valve 32 isolates heat exchanger 26 fluidly from splitter 28. The external cooling state has the advantages of simplicity and passivity: so long as fuel from splitter 28 is relatively cool compared to electronic control device 24, the fuel will cool electronic control device 24 without the need for any additional cooling elements.

When the fuel reaches a set cut-off transition temperature beyond which it can no longer effectively cool electronic control device 24, valve 32 switches to the isolation state mentioned above so as to retain cooling capacity. In various embodiments this cut-off temperature falls within the range of approximately 54° C. to 74° C. (~130 to ~165° F.) for existing technology. Depending on other factors such as the effectiveness of insulation 40, other cut-off temperatures may be used. In the isolation state, fuel arriving at valve 32 from splitter 28 is routed immediately back to splitter 28, and fuel leaving heat exchanger 26 is cooled and recycled via a recirculation loop incorporating fluid pump 34 and heat pump 36. While valve 32 is in this second state, coolant fuel leaving heat exchanger 26 is circulated by fluid pump 34 through heat pump 36, which expels heat from the fuel into heat sink 38, and then back through heat exchanger 26 in a closed loop. Heat pump 36 and fluid pump 34 communicate with electronic control device 24 via signals FP and HP.

Fluid pump 34 comprises any conventional low-volume, low-power fluid pump. Heat pump 36 comprises a fuel-air heat exchanger, thermal-electric cooler, or analogous device. Heat exchanger 26 comprises a cooling plate adjacent to electronic control device 24, a means of directly routing cooling fuel through electronic control device 24, or any other conventional method for removing heat from electronic control device 24 into coolant. Heat sink 38 comprises the air stream around gas turbine engine 12, fuel from the fuel system of gas turbine engine system 10, or any other local medium suitable for dumping heat. Electronic control device 24 comprises an electronic engine control (EEC) or full authority digital engine control (FADEC) device.

In one embodiment, splitter 28 rejoins fuel from valve 32 with the fuel line to combustor 16, and incorporates appropriate valving to insure that pressure across splitter 28 remains constant. In a second embodiment, splitter 28 returns fuel from valve 32 to fuel tank 20, rather than rejoining the fuel with the fuel line to combustor 16.

Because this cooling system is capable in all embodiments of removing large amounts of heat from heat exchanger 26, electronic control device 24 can be located in the hot region near gas turbine engine 12, removing the need for a long, heavy harness for wiring lines communicating signals EC and PC. Furthermore, because of the incorporation of valve 32 and heat pump 36, the ability of heat exchanger 26 to remove heat from electronic control device 24 is not dependant on the temperature of fuel from fuel pump 22. While fuel from fuel pump 22 is cool enough to be used as coolant, it is fed directly to heat exchanger 26; when this fuel becomes too hot, heat exchanger 26 is instead fed cooled, recirculated fuel. This independence from fuel temperature allows electronic control device 24 to function even in extreme temperature conditions not handled by the prior art.

Several distinct embodiments of the two-state cooling system described above (comprising valve 32, fluid pump 34, heat pump 36, and heat exchanger 26) are explained in further detail in FIGS. 2A, 2B, 3A, 3B, 4A, and 4B.

Figure 2A:
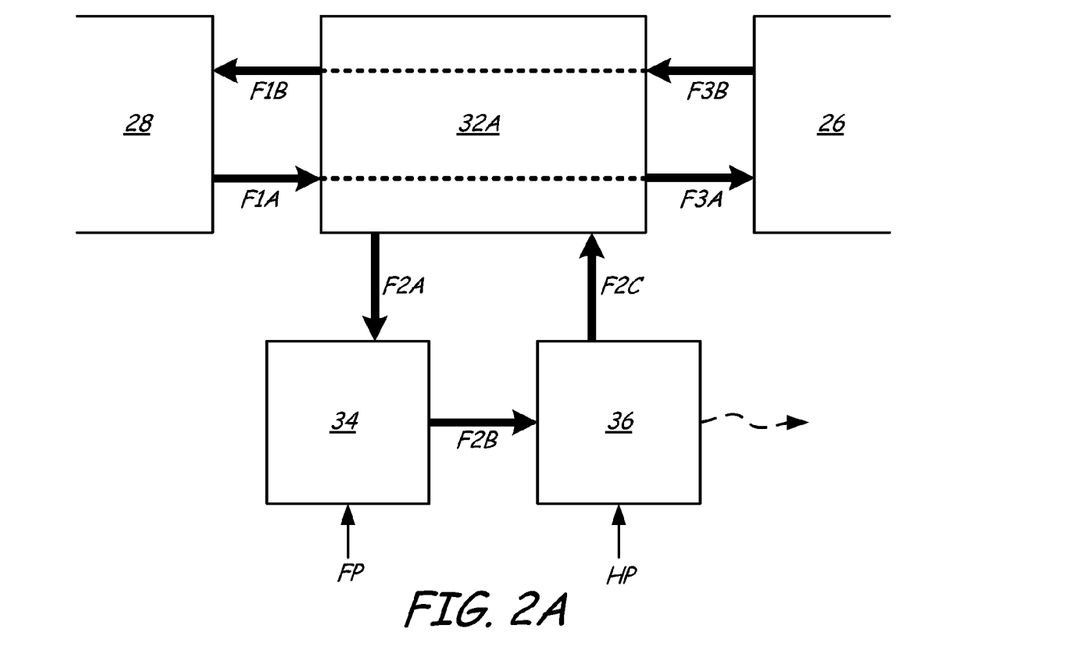
FIG. 2A is a flow chart depicting the flow of cooling fluid through valve 32 of FIG. 1 in an external cooling state.
Figure 2B:
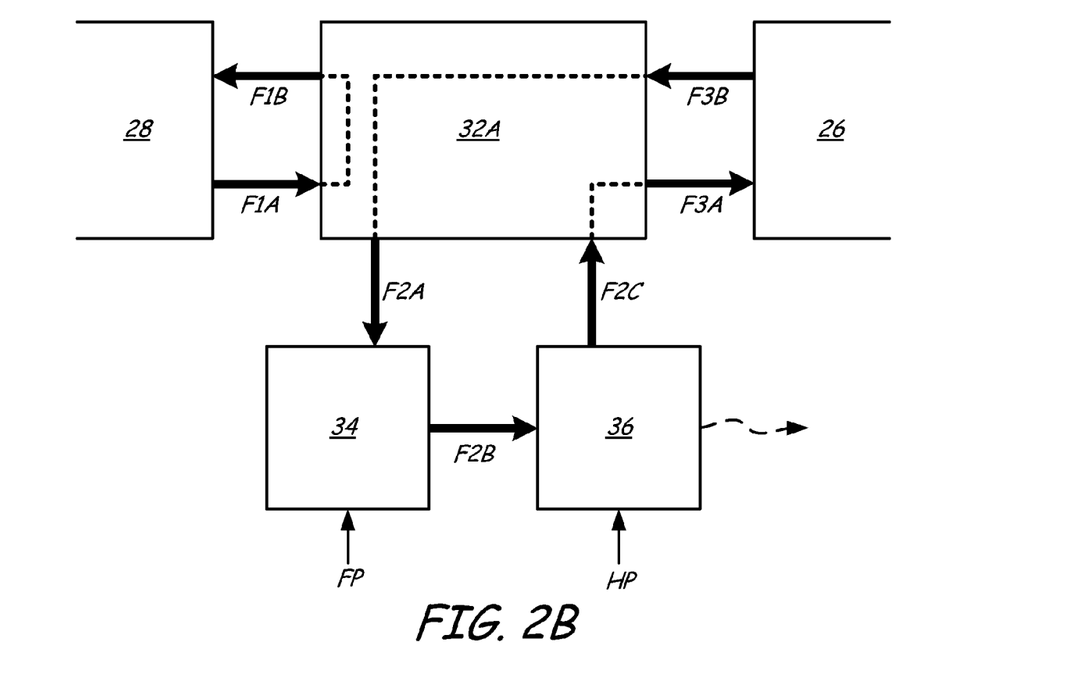
FIG. 2B is a flow chart depicting the flow of cooling fluid through valve 32 of FIG. 1 in an isolation state.

FIGS. 2A and 2B are flow charts illustrating one embodiment of valve 32 from FIG. 1 and its surrounding plumbing. FIG. 2A shows valve 32 in the external cooling state, while FIG. 2B shows valve 32 in the isolation state. FIGS. 2A and 2B depict splitter 28, valve 32A (an embodiment of valve 32 from FIG. 1), fluid pump 34, heat pump 36, and heat exchanger 26. Fluid lines F1A through F3B connect these components.

In the external cooling state, valve 32A directs relatively cool fuel from splitter 28 to heat exchanger 26 via fuel lines F1A and F3A. Heat exchanger 26 dumps heat from electronic control device 24 into the fuel, then directs the fuel back through valve 32 into splitter 28 via fuel lines F3B and F1B. In one embodiment, electronic control device 24 is insulated, shielding it from on the order of 1000 watts of environmental heat, such that heat exchanger 26 need only remove on the order of 100 watts of electronic waste heat from electronic control device 24. At some temperature above the fixed cut-off temperature, the fuel is no longer capable of removing sufficient waste heat from electronic control device 24. Therefore, valve 32 is actuated to switch to the isolation state at the fixed cut-off temperature.

In the isolation state, valve 32A directs fuel above the cut-off temperature away from electronic control device 24. Fuel coming from splitter 28 via fluid line F1A is sent back by valve 32 into splitter 28 via fluid line F1B. In this state, fuel flows as coolant through the closed loop comprising heat exchanger 26, fluid pump 24, and heat pump 36. Heat pump 36 expels heat from the coolant fuel into heat sink 38 of FIG. 1, while fluid pump 34 circulates the fuel through the closed loop. As depicted in FIG. 2B, fuel flows, in order, through valve 32A, fluid line F2A, fluid pump 34, fluid line F2B, heat pump 36, fluid line F2C, valve 32A, fluid line F3A, heat exchanger 26, and fluid line F3B back to valve 32A, completing the fluid circuit. The order of fluid pump 34, heat pump 36, valve 32, and heat exchanger 26 in this closed recirculation loop can be varied without altering the functionality of the cooling system.

All embodiments of valve 32, including valve 32A, switch between external cooling and isolation states depending on the temperature of fuel at splitter 28 or at other nearby positions outside of the closed loop, such as the at fuel tank 20 or fuel pump 22. In one mode, this switching is accomplished by constructing valve 32 of thermally deforming wax valves or bimetallic valves which passively switch to an isolation state in response to temperatures above the set cut-off temperature, and passively switch to an external cooling state in response to temperatures below the set cut-off temperature. In another mode, the switching of valve 32 is controlled by electronic control device 24, which monitors fuel temperature via temperature sensor 30.

In one embodiment of the invention, fluid pump 34 and heat pump 36 are activated only while valve 32 (in any of its embodiments) is in the isolation state, and deactivated while valve 32 (in any of its embodiments) is in the external cooling state. This conserves power when additional cooling is unnecessary, and when fuel pump 22 is sufficient to circulate fuel through heat exchanger 26. To this end, in one embodiment electronic control device 24 sends signal FP to fluid pump 34 and signal HP to heat pump 36 to activate or deactivate, depending on temperature. In another embodiment, fluid pump 34 and heat pump 36 are not connected to electronic control device 24, but are instead directly connected to temperature sensor 30, and actuated to shut on or off depending on the reading of temperature sensor 30.

Figure 3A:
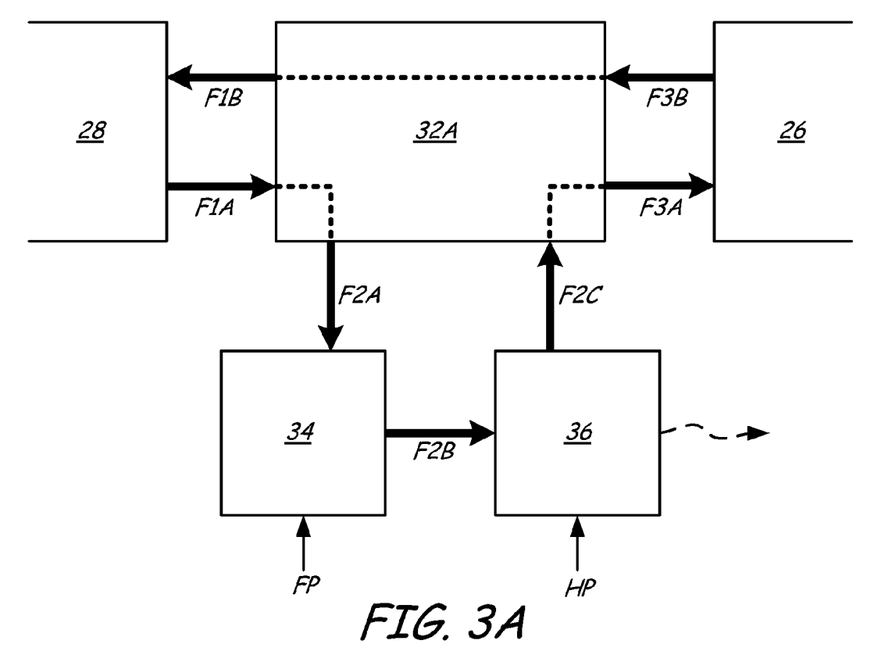
FIG. 3A is a flow chart depicting a second embodiment of the flow of cooling fluid through valve 32 of FIG. 1 in an external cooling state.
Figure 3B:
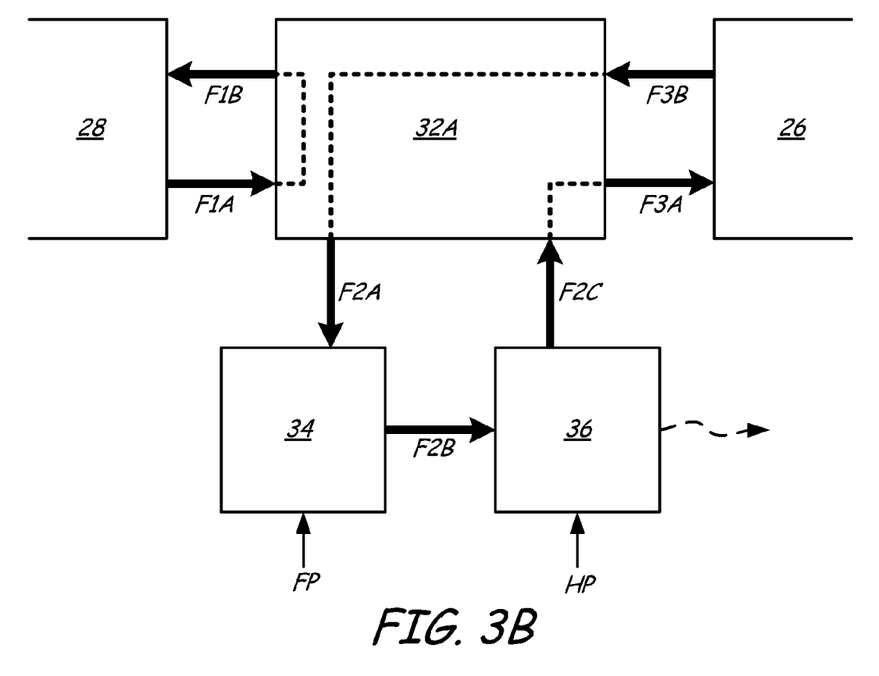
FIG. 3B is a flow chart depicting the second embodiment of the flow of cooling fluid through valve 32 of FIG. 1 in an isolation state.

FIGS. 3A and 3B are flow charts illustrating a second embodiment of valve 32 from FIG. 1 and its surrounding plumbing. FIG. 3A shows valve 32 in the external cooling state, while FIG. 3B shows valve 32B in the isolation state. FIGS. 3A and 3B depict splitter 28, valve 32B (an embodiment of valve 32 from FIG. 1), fluid pump 34, heat pump 36, and heat exchanger 26. Fuel lines F1A through F3B connect these components.

The embodiment of FIGS. 3A and 3B differs from the embodiment of FIGS. 2A and 2B only in the workings of valve 32B, which replaces valve 32A of FIGS. 2A and 2B. In the external cooling state of FIG. 3A, fuel traverses the entirety of the system, rather than bypassing fluid pump 34 and fluid pump 36. Fuel flows, in order, through fluid line F1A, valve 32B, fluid line F2A, fluid pump 34, fluid line F2B, heat pump 36, fluid line F2C, valve 32B, fluid line F3A, heat exchanger 26, fluid line F3B, valve 32B, and fluid line F1B. As in the embodiment depicted in FIGS. 2A and 2B, heat pump 36 and fluid pump 34 can be deactivated while valve 32B is in the external cooling state. Alternatively, heat pump 36 can be left on during some or all of the time that valve 32 is in the external cooling state to provide additional instantaneous cooling for fuel passing through heat exchanger 26.

In the isolation state of FIG. 3B, valve 32B operates just as valve 32A, closing off the same recirculation loop to cool electronic control device 24. The embodiment of FIGS. 3A and 3B is functionally similar to the embodiment of FIGS. 2A and 2B, but also offers a simplified version of valve 32, and the possibility of instantaneous cooling.

Figure 4A:
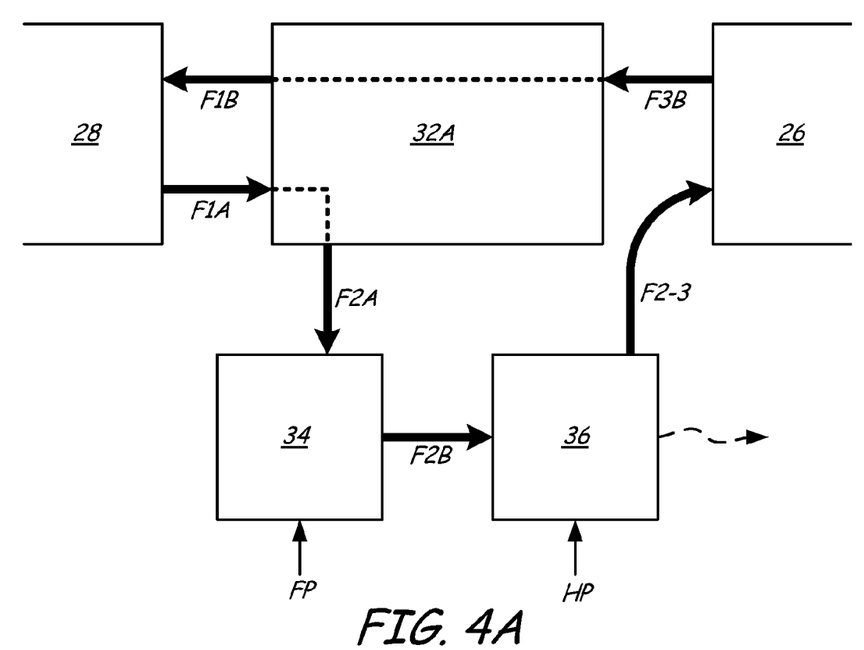
FIG. 4A is a flow chart depicting a third embodiment of the flow of cooling fluid through valve 32 of FIG. 1 in an external cooling state.
Figure 4B:
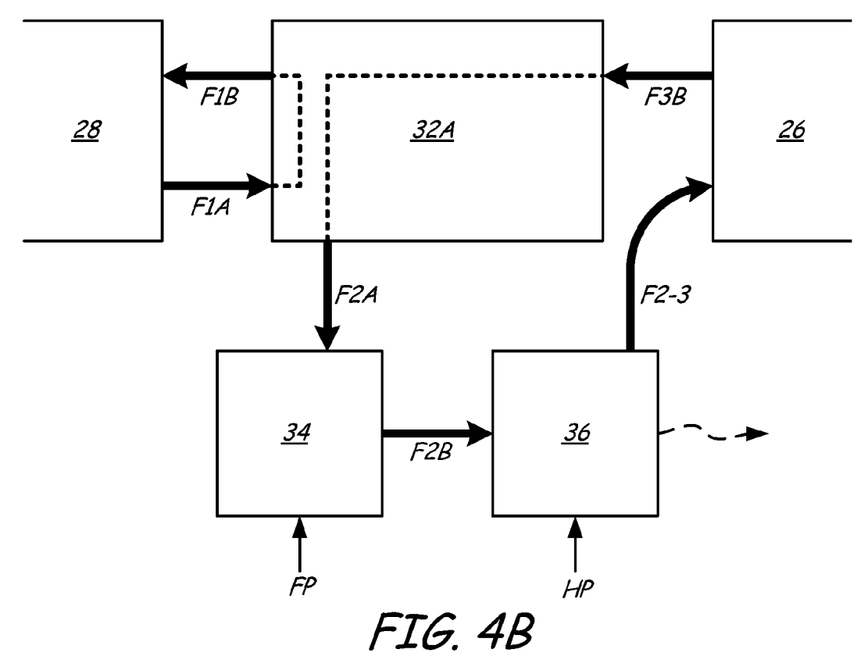
FIG. 4B is a flow chart depicting the third embodiment the flow of cooling fluid through valve 32 of FIG. 1 in an isolation state.

FIGS. 4A and 4B are flow charts illustrating a third embodiment of valve 32 from FIG. 1, and its surrounding plumbing. FIG. 4A shows valve 32 in the external cooling state, while FIG. 4B shows valve 32C in the isolation state. FIGS. 4A and 4B depict splitter 28, valve 32C (an embodiment of valve 32 from FIG. 1), fluid pump 34, heat pump 36, and heat exchanger 26. Fuel lines F1A through F3B connect these components.

The embodiment of FIGS. 4A and 4B differs from the embodiment of FIGS. 3A and 3B only in the workings of valve 32C and the replacement of fluid lines F2C and F3A with a single fluid line F2-3. FIGS. 4A and 4B present a simplification to the fluid flow system of FIGS. 3A and 3B wherein only two flow lines ever pass through valve 32. In the external cooling state of this embodiment, fuel flows, in order, through fluid line F1A, valve 32C, fluid line F2A, fluid pump 34, fluid line F2B, heat pump 36, fluid line F2-3, heat exchanger 26, fluid line F2B, valve 32C, and fluid line F1B.

In the isolation state of the embodiment of FIGS. 4A and 4B, valve 32A directs fuel above the cut-off temperature away from electronic control device 24. Fuel coming from splitter 28 via fluid line F1A is sent back by valve 32C into splitter 28 via fluid line F1B. As depicted in FIG. 4B, fuel flows, in order, through valve 32C, fluid line F2A, fluid pump 34, fluid line F2B, heat pump 36, fluid line F2-3, heat exchanger 26, and fluid line F3B back to valve 32A, completing the fluid circuit.

The embodiment of FIGS. 4A and 4B requires less complex plumbing and valve construction than the embodiment of FIGS. 3A and 3B. It may therefore be lighter, cheaper, and easier to build.

Figure 5:
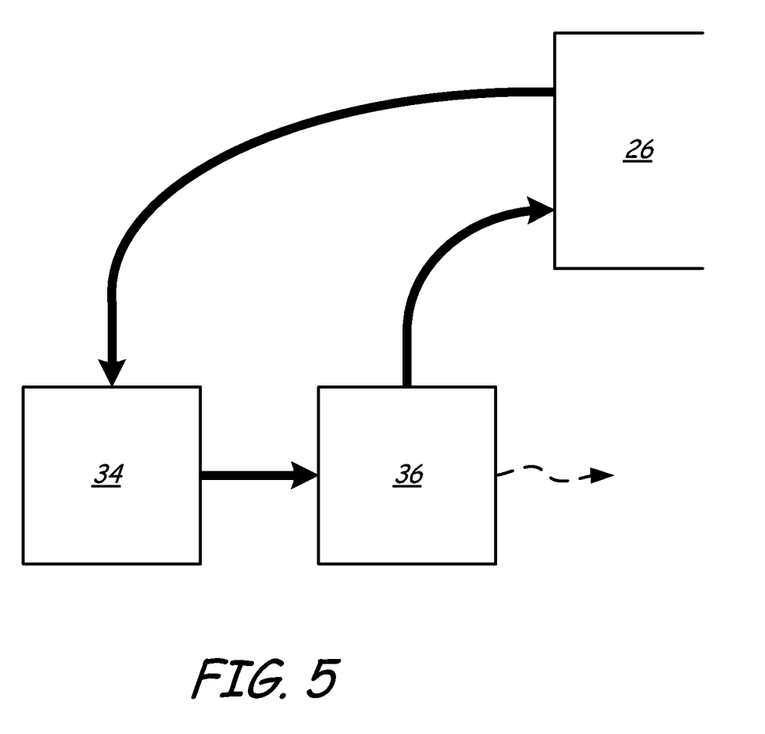
FIG. 5 is a flow chart depicting a permanently isolated cooling loop for cooling the electronic control device.

FIG. 5 depicts a permanently isolated cooling loop for cooling electronic control device 24. This loop comprises heat exchanger 26, fluid pump 34, and heat pump 36. This embodiment dispenses altogether with valve 32, directly connecting the three aforementioned elements in a closed fluid cooling loop. This cooling loop is functionally similar to the closed cooling loops depicted in the isolation states of FIGS. 2B, 3B, and 4B. In one embodiment, fluid pump 34 and heat pump 36 are selectively activated (by electronic control device 24 or through other mechanisms) whenever the temperature of electronic control device 24 exceeds a fixed cut-off temperature. In another embodiment, fluid pump 34 and heat pump 36 are always on whenever electronic control device is running. Because the loop of FIG. 5 always recirculates the same fluid, a more efficient coolant than fuel can be used, such as ethylene glycol or any coolant already used for another system in gas turbine engine system 10. Depending on the coolant used, the cooling loop of FIG. 5 can draw coolant from the same reservoir as other cooling systems in gas turbine engine system 10, or be integrated directly into the coolant circuits of those other systems. Because the embodiment shown in FIG. 5 need not use fuel as coolant, it can be disconnected from the fuel system of gas turbine engine system 10, and splitter 28 can be removed. This embodiment sacrifices the passive simplicity of the external cooling configurations of other embodiments in return for the advantage of a more efficient coolant fluid.

Although the embodiments described above provide cooling for electronic engine control devices, other electronic devices in the vicinity of the gas turbine engine, such as airframe avionics or power electronics, may alternatively or additionally be cooled using the same or substantially similar means.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A cooling system for electronics in a gas turbine engine system, comprising:
    a fluid recirculation loop, comprising:
        a fluid line to carry coolant fluid;
        a heat pump on the fluid line for removing heat from coolant fluid; and
        a fluid pump on the fluid line to circulate coolant fluid through the loop;
    an electronic device in the gas turbine engine system, the electronic device being in thermal communication with the fluid recirculation loop;
    a fuel system having a fuel splitter to supply fuel to the gas turbine engine system and to supply a portion of the fuel to cool the electronic device, and
    a valve in fluid communication with the fluid line and the fuel system, wherein the valve is configured to cut-off when the fuel reaches a predetermined temperature.

2. The cooling system of claim 1, wherein the valve supplies fuel from the fuel system to the loop as coolant fluid; and wherein the circulation loop switched between two states by the valve, such that: while the valve is in a first state, fuel from the fuel system cool the electronic device; and while the valve is in a second state, the electronic device is fluidly isolated from the fuel system.

3. The cooling system of claim 2, wherein the valve is a passive thermal displacement valve which is in the first state when the temperature of fuel from the fuel system is below a fixed cut-off temperature, and is in the second state when the temperature of fuel from the fuel system is above the fixed cut-off temperature, the cut-off temperature corresponding to a temperature at which the electronic device operates.

4. The cooling system of claim 2, further comprising a temperature sensor connected to the electronic device, wherein the valve is controlled by the electronic device, which actively switches the valve to the first state when the temperature sensor detects that the temperature of fuel from the fuel system is below a cut-off temperature, and actively switches the valve to the second state when the temperature sensor detects that the temperature of fuel from the fuel system is above the cut-off temperature, the cut-off temperature corresponding to a temperature at which the electronic device effectively operates.

5. The cooling system of claim 2, wherein the heat pump and fluid pump are deactivated when the valve is in the first state, and reactivated when the valve is in the second state.

6. The cooling system of claim 1, wherein the electronic device is an electronic engine control (EEC) device or a full authority digital engine control (FADEC) unit which governs fuel supply to the gas turbine engine.

7. The gas turbine engine system of claim 1, wherein the electronic device is connected to the fluid recirculation loop either directly, with coolant fluid running through the electronic device to cool it, or indirectly, with coolant fluid running through a cooling plate adjacent to the electronic device.

8. A gas turbine engine system comprising:
a compressor for compressing gas within the gas turbine engine;
a fuel system having a fuel splitter for providing fuel to the gas turbine engine and for providing a portion of the fuel to a valve;
a combustor that mixes the fuel with the compressed gas and ignites the mixture of fuel and gas, causing the mixture to expand;
a turbine for extracting energy from the expanding mixture;
an electronic control device for managing fuel input to the combustor, in thermal communication with the fuel; and
a cooling system with a fluid recirculation loop in thermal communication with the electronic control device, the cooling system comprising: a fluid line in fluid communication with the valve to circulate coolant fluid;
a heat pump on the fluid line for removing heat from coolant fluid; and
a fluid pump on the fluid line to circulate coolant fluid through the fluid recirculation loop, wherein the valve is configured to cut-off when the fuel reaches a predetermined temperature.

9. The gas turbine engine system of claim 8, wherein: the fluid line is connected to the fuel system to provide fuel as the coolant; and the recirculation loop switched between two states by the valve, such that: while the valve is a first state, the fuel from the fuel system cools the electronic control device; and while the valve is a second state, the electronic control device is fluidly isolated from the fuel system such that fuel circulating through the recirculation loop cools the electronic device.

10. The gas turbine engine system of claim 9, wherein the valve is a passive thermal displacement valve which is in the first state when the temperature of fuel from the fuel system is below a cut-off temperature, and is in the second state when the temperature of fuel from the fuel system is above the cut-off temperature, the cut-off temperature being a temperature at which the electronic control device operates.

11. The gas turbine engine system of claim 10, wherein the valve is comprised of a thermal displacement valve selected from the group consisting of thermal wax valves and bi-etallic disk valves.

12. The gas turbine engine system of claim 9, further comprising a temperature sensor that determines the temperature of fuel from the fuel system, wherein the valve is actively switched to the first state when the temperatures sensor detects that the temperature of fuel from the fuel system is below a cut-off temperature, and actively switched to the second state when the temperature sensor detects that the temperature of fuel from the fuel system is above the cut-off temperature, said cut-off temperature being a temperature at which the electronic control device effectively operates.

13. The gas turbine engine system of claim 12, wherein the switching of the valve is controlled by the electronic control device, based on the reading of the temperature sensor.

14. The gas turbine engine system of claim 9, wherein the heat pump and fluid pump are automatically deactivated when the valve is in the first state, and activated when the valve is in the second state.

15. The gas turbine engine system of claim 9, wherein the recirculation loop is arranged in a bypass configuration such that, while the valve is in the first state, fuel can flow from the fuel system to cool the electronic control device without passing through the fluid pump or heat pump.

16. The gas turbine engine system of claim 9, wherein the recirculation loop is arranged in an inclusive configuration such that, while the valve is in the first state, fuel from the fuel system can flow through the fluid pump and the heat pump to cool the electronic control device.

17. The gas turbine engine system of claim 8, wherein the heat pump is comprised of a pump from among the group consisting of fuel-air heat exchangers and thermal-electric coolers.

18. The gas turbine engine system of claim 8, wherein the electronic control device is connected to the cooling loop directly, with coolant fluid running through the electronic control device to cool it.

19. The gas turbine engine system of claim 8, wherein the electronic control device is connected to the cooling loop indirectly, with the coolant fluid running through a cooling plate adjacent to the electronic control device to cool the electronic control device.

20. The gas turbine engine system of claim 8, wherein the coolant fluid is a fluid with greater heat capacity than fuel.

* * * * *

UNITED STATES PATENT AND TRADEMARK OFFICE
CERTIFICATE OF CORRECTION

PATENT NO. : 8,424,285 B2  
APPLICATION NO. : 12/533216  
DATED : April 23, 2013  
INVENTOR(S) : Leo J. Veilleux, Jr.

Page 1 of 1

It is certified that error appears in the above-identified patent and that said Letters Patent is hereby corrected as shown below:

In the Claims

Col. 8, Line 11
  Delete "bi-etallic"
  Insert --bimetallic--

Signed and Sealed this
Twenty-fourth Day of December, 2013

Margaret A. Focarino
*Commissioner for Patents of the United States Patent and Trademark Office*